Sept. 27, 1960

R. H. HARDIN 2,954,467

GATING CIRCUIT

Filed Jan. 30, 1958

INVENTOR.
ROBERT H. HARDIN,
BY
Robert H. Himes
AGENT 2,954,467
Patented Sept. 27, 1960

2,954,467

GATING CIRCUIT

Robert H. Hardin, Los Angeles, Calif., assignor to Hughes Aircraft Company, Culver City, Calif., a corporation of Delaware Filed Jan. 30, 1958, Ser. No. 712,268
3 Claims. (Cl. 250—27)

Figure 1:
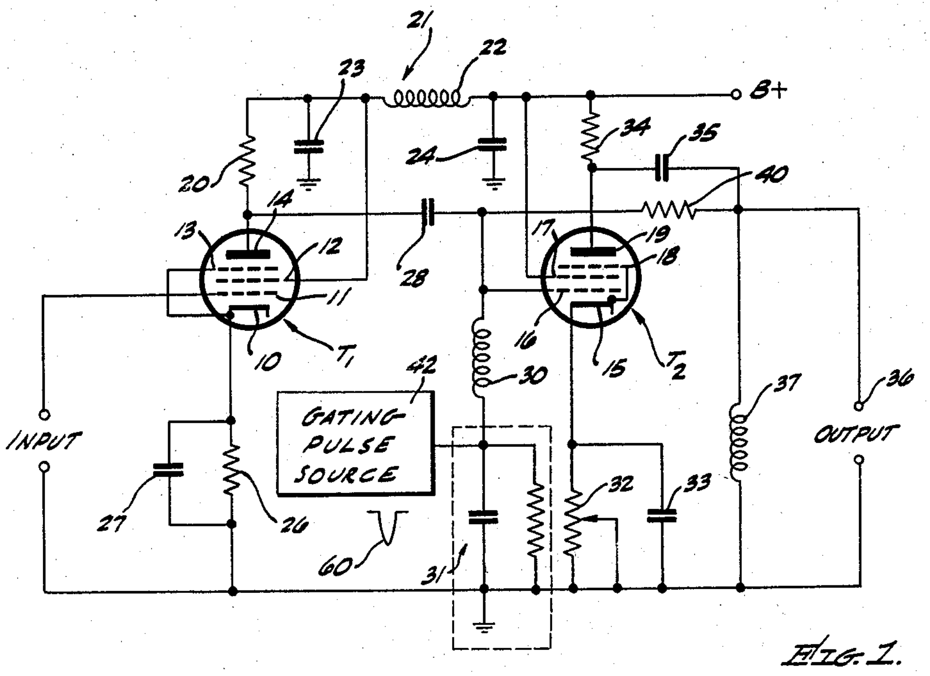

This invention relates to gating circuits and more particularly to a gating circuit especially adapted to pass low-level intermediate frequency signals with no adverse results due to ringing.

In conventional gating circuits wherein a receiver is activated by applying a voltage excursion to an element of a tube normally cut off, thereby allowing the tube to conduct for the duration of the excursion, there results a small amount of ringing, i.e., damped oscillations, in the parallel resonant circuit which serves as a load impedance for the stage being gated. When this gating is effected at high levels of signals, for example, at a stage which is near the output circuit of an I.F. amplifier, the amplitude of the ringing is sufficiently small compared with the amplitude of the signal being gated that is of negligible consequence and there exists no desirable results.

When the aforementioned type of gating is employed on a stage near the input stage of the I.F. amplifier where the signal to be amplified is at an extremely low-level, for example, on the stage immediately subsequent to the low noise input stage of the amplifier, the amplitude of the ringing associated with the gating is generally greater than the amplitude of the signal being amplified. Hence, the ringing associated with the gating completely masks the desired signal whereby it is apparent that this type of gating is rendered useless for low level signals. Further, it has been noted that applying the gating pulse through a series or shunt diode does not completely eliminate the ringing whereby it is necessarily amplified in subsequent stages along with the desired signal.

It is therefore an object of the present invention to provide an improved low-level intermediate frequency gating circuit.

Another object of the invention is to provide an apparatus capable of gating a low-level intermediate-frequency signal without the introduction of a ringing signal.

In accordance with the present invention, a stage for gating purposes will be inserted immediately subsequent to the initial low noise level stage which is generally employed in pre-amplifiers or I.F. amplifiers. Both the low noise level stage and the gated stage preferably include pentode type amplifier tubes although this is not absolutely essential to the successful operation of the device. Under normal or ungated operating conditions, the gated stage is provided with negative feedback of a magnitude to reduce the transfer voltage ratio to zero. Gating is then accomplished by rendering the tube of the gated stage non-conductive whereby the signal to be gated is coupled through the feedback network to the output of the gating circuit which output may be connected to the next succeeding stage of the pre-amplifier or I.F. amplifier.

Figure 2:
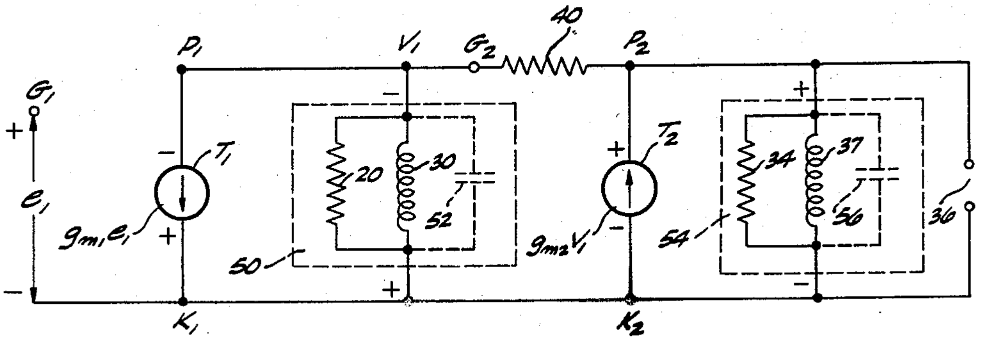

The above-mentioned and other features and objects of this invention and the manner of attaining them will become more apparent by reference to the following description taken in conjunction with the accompanying drawings, wherein:

Fig. 1 is a schematic circuit diagram of the device of the present invention; and Fig. 2 is an equivalent circuit diagram of the device of Fig. 1.

Referring now to Fig. 1 of the drawings, there is illustrated a schematic circuit diagram of the device of the present invention. The device comprises tubes $T_1$ and $T_2$ which are preferably of the pentode type, although other types of tubes may be employed. As a pentode tube, $T_1$ includes a cathode 10, a control grid 11, a screen grid 12, suppressor grid 13 and a plate 14. $T_2$, on the other hand, includes a cathode 15, a control grid 16, a screen grid 17, a suppressor grid 18 and a plate 19. The first low noise level stage incorporating $T_1$ is then provided by connecting a plate 14 of tube $T_1$ through a load resistor 20 and an isolating network 21 to a source of B+ potential. The isolating network 21 may, for example, constitute an RF choke or inductor 22 connected in series from the source of B+ potential to the resistor 20 together with capacitors 23 and 24 shunted to ground at each extremity of the inductor 22. An isolating network such as network 21 is conventionally used on low noise level stages to prevent regenerative feedback from the output stages of the amplifier. Proper bias for this stage is provided by connecting the cathode 10 of the tube $T_1$ through a cathode resistor 26 to a source of substantially fixed potential such as, for example, ground. The cathode resistor 26 is, in turn, by-passed by a capacitor 27 so as to maintain the cathode 10 at ground potential for radio frequency purposes. Also, as is conventional, the suppressor grid 13 is maintained at the same potential as the cathode 10 by means of a connection thereto and the screen grid 12 is connected to the junction between the load resistor 20 and isolating network 21 thereby to maintain this grid at the available B+ potential. Last, an input to the low noise level stage is provided by connections from the input terminals to the control grid 11 of the tube $T_1$ and to ground, respectively. Also, an output signal from the stage is provided by connections through a coupling capacitor 28 to the junction between load resistor 20 and plate 14 of the tube $T_1$.

The output signal of the low noise level stage is applied across a coil 30 connected in series with a resistor-capacitor network 31 to ground. The signal thus developed across the coil 30 and the resistor-capacitor network 31 is applied to the control grid 16 of the tube $T_2$ which tube together with its associated circuitry constitutes the gating stage of the device of the present invention. The bias for the tube $T_2$ is provided by connecting the cathode 15 thereof through a variable resistor 32 to ground. In order to maintain the cathode 15 at radio frequency ground, the variable resistor 32 is by-passed by a capacitor 33. Also, as is conventional, the suppressor grid 18 is maintained at the same potential as that of the cathode 15 by means of an appropriate connection thereto and the screen grid 17 is connected to the source of B+ potential. Lastly, the plate 19 of tube $T_2$ is connected through a load resistor 34 to the source of B+ potential. An output signal from the gating stage is provided by connecting the junction between plate 19 of the tube $T_2$ and the load resistor 34 through a coupling capacitor 35 to output terminals 36. These output terminals are in turn shunted by a coil 37 which is adapted to tune out stray capacitance that inherently exists in such a circuit.

In accordance with the present invention, negative feedback of such a magnitude as to make the transfer voltage ratio equal to zero is applied from the output to the input of the gating stage at times when the tube $T_2$ is normally conducting. This negative feedback may be provided, for example, by connecting a feedback resistor 40 from the output terminals 36 to the control grid 16 of the tube $T_2$. As will be hereinafter explained in more detail, the conductance of the resistor 40 should be substantially equal to the mutual-conductance of the tube $T_2$, when pentodes are employed, to effect a transfer voltage ratio equal to zero. The mutual-conductance of the tube $T_2$ may be adjusted, within limits, by means of the variable resistor 32 which is in its cathode circuit.

Thus, as explained above, the output signal available at the output terminals 36 of the gating stage is normally of zero amplitude when the tube $T_2$ is conducting, that is, when the tube is, in effect, functioning as an amplifier. In order to gate, it is necessary to change the relative value of the mutual-conductance of the tube $T_2$ with respect to the conductance of resistor 40. An expedient way of accomplishing this is to render the tube $T_2$ non-conductive. This may be accomplished by pulsing an appropriate element on the tube $T_2$ with a voltage excursion of proper amplitude and polarity. In that the plate 19 and screen grid 17 require voltage pulses of magnitudes comparable to the B+ potential, it is preferable to apply a pulse between the control grid 16 and the cathode 15. This may conveniently be accomplished by coupling a gating pulse source 42 to the junction between the coil 30 and the resistor-capacitor network 31. When applied in this manner, the voltage excursion of the pulse should, of course, be in a negative direction. Also, the capacitor of the resistor-capacitor network 31 should be of a size to allow the signal developed across the coil 30 to by-pass to ground and yet be sufficiently small as to enable the pulse to be developed thereacross. The resistor of the network 31, on the other hand, completes a direct-current return from the control grid 16 to ground.

In order to explain more clearly the present invention, reference is made to Fig. 2 which illustrates an equivalent circuit of the alternating current portion of the apparatus shown in Fig. 1. More particularly, $G_1$, $K_1$ and $P_1$ represent the control grid 11, the cathode 10 and the plate 14, respectively, of the pentode tube $T_1$, and $G_2$, $K_2$ and $P_2$ represent the control grid 16, the cathode 15 and the plate 19, respectively, of the pentode tube, $T_2$. In that pentode tubes have been employed, a nodal analysis will be presented wherein the tubes $T_1$ and $T_2$ will be considered as "current sources" as distinguished from voltage generators. In the equivalent circuit, the tube $T_1$ may be represented as having an equivalent load impedance 50 which constitutes the load resistor 20, the coil 30 and a capacitor 52, representative of the stray capacitance, all connected in parallel. Also, the tube $T_2$ may be represented as having an equivalent load impedance 54 which constitutes the load resistor 34, the coil 37 and a capacitor 56, which represents stray capacitance, all connected in parallel. Also, in an analysis of this type, the plate resistance of the tubes $T_1$ and $T_2$ is very large and would appear in shunt with the equivalent load impedances 50, 54, respectively, whereby it is evident that the plate resistances may be neglected. Similarly, the plate to control grid capacitance of the tubes $T_1$ and $T_2$ is very small and therefore may be neglected in the analysis. It is to be noted that the impedances introduced by coupling capacitors 28, 35 and the by-pass capacitors 27, 33 have also been neglected. This is a permissible assumption in that the device is primarily adapted to gate intermediate-frequency signals. Thus, the feedback resistor 40 may be represented as being connected directly from the plate 19 to the control grid 16 of the tube $T_2$, that is, directly from $P_2$ to $G_2$ in the equivalent circuit of Fig. 2. Further, as is generally the case in I.F. amplifiers, the load impedances 50, 54 are, as previously specified, at parallel resonance. That is, the coils 30, 37 of impedances 50, 54 tune out the stray capacitance represented by capacitors 52, 56, respectively. It is thus apparent that the admittances of the load impedances 50, 54 will constitute pure conductances.

The parameters on the equivalent circuit diagram of Fig. 2 and in the analysis may then be designated as follows:

| | |
|---|---|
| Mutual-conductance of tube $T_2$ | $g_{m1}$ |
| Mutual-conductance of tube $T_2$ | $g_{m2}$ |
| Admittance of load impedance **50** at parallel at parallel resonance | $g_1$ |
| Admittance of load impedance **54** at parallel resonance | $g_2$ |
| Conductance of feedback resistor **40** | $g_{12}$ |
| Signal input | $e_1$ |
| Output signal from tube $T_1$ | $V_1$ |
| Output signal at output terminals **36** | $e_2$ |

In a nodal analysis, the sum of the currents flowing into any junction must always equal the current flowing away from the junction. Thus, on the basis of the polarity indicated in the equivalent circuit of Fig. 2, the currents flowing from and towards the junction $P_1$—$G_2$ are as follows:

$$g_{m1}e_1=V_1g_1+(e_2+V_1)g_{12} \tag{1}$$

Similarly, the current flowing from and towards the junction $P_2$ are as follows:

$$g_{m2}V_1=e_2g_2+(e_2+V_1)g_{12} \tag{2}$$

Thus, from Equations 1 and 2, the transfer voltage ratio $$\frac{e_2}{e_1}$$

becomes $$\frac{e_2}{e_1}=\frac{g_{m1}(g_{m2}-g_{12})}{g_{12}(g_{m2}+g_1+g_2)+g_1g_2} \tag{3}$$

From Equation 3 it is evident that the transfer voltage ratio $$\frac{e_2}{e_1}$$

becomes zero when $g_{m2}=g_{12}$. In the event that $T_2$ is a type 6AK5 which has a mutual-conductance of 4000 micro-mhos, the feedback resistor 40 would have a resistance of 250 ohms.

When the gating stage including tube $T_2$ is rendered non-conductive by application of a pulse or other voltage excursion from gating pulse source 42, $g_{m2}$ becomes equal to zero thereby to result in a voltage gain. In the circuit of Fig. 1, the output signal available from the low noise level stage including tube $T_1$ is effectively connected from the plate 14 of Tube $T_1$ through the coupling capacitor 28 and the feedback resistor 40 to the output terminals 36 during intervals when the tube $T_2$ is rendered non-conductive by a gating pulse.

By adjusting the variable resistor 32 in the cathode circuit of the tube $T_2$ for minimum output signal when the tube is conducting, an off-on gating ratio of at least 40 decibels is easily achieved without neutralizing the grid-to-plate capacitance. Further, when a sine wave alternation such as pulse 60, in Fig. 1, is employed as the gating pulses, it has been found that the device of the present invention may be followed by an I.F. amplifier of approximately 100 decibels gain without "spikes" due to ringing in the output.

Another advantage of this circuit over those in which a tube is pulsed into conduction during the time the receiver is turned on by the application of a gating pulse to a high gain element of the tube is the following. In the latter type circuit, any ripples or other variations from a constant value at the top of the gating pulse will be amplified in the I.F. amplifier if these variations contain frequencies which lie within the pass band of the amplifier thereby masking the desired signal. In the circuit of the present invention, on the other hand, the bottom of the gating pulse can have any shape, since the tube is cut off during the gating intervals and hence will not pass any of the characteristics of the gating pulse.

What is claimed is:

1. A gating apparatus comprising a source of signals to be gated; an electron discharge device including a control grid, a cathode and a plate, said control grid being coupled directly to said source of signals; means for maintaining a bias potential between said control grid and said cathode of said electron discharge device; a source of B+ potential; a load impedance connected between said plate and said source of B+ potential whereby said electron discharge device conducts a flow of current; a feedback resistor coupled from said plate to said control grid of said electron discharge device, said feedback resistor having a conductance substantially equal to the mutual-conductance of said electron discharge device whereby the amplitude of said signals to be gated which develop across said load impedance is substantially zero; and means coupled through a coil to said control grid of said electron discharge device for applying a voltage excursion between said control grid and said cathode of a magnitude and polarity to render said electron discharge device non-conductive for predetermined intervals of time thereby to make said signals to be gated available at the junction between said load impedance and said plate during said predetermined intervals of time.

2. The gating apparatus as defined in claim 1 wherein said voltage excursion applied between said control grid and said cathode of said electron discharge device has the wave form of one alternation of a sine wave thereby to minimize ringing signals across said load impedance.

3. The gating apparatus as defined in claim 1 wherein said electron discharge device constitutes a pentode tube.

References Cited in the file of this patent

UNITED STATES PATENTS

| | | |
|---|---|---|
| 2,289,338 | Bertram et al. | July 14, 1942 |
| 2,379,042 | Shaw | June 26, 1945 |
| 2,531,201 | De Lange | Nov. 21, 1950 |
| 2,544,340 | Maxwell | Mar. 6, 1951 |
| 2,831,971 | Wischmeyer | Apr. 22, 1958 |
| 2,868,971 | Wischmeyer | Jan. 13, 1959 |

FOREIGN PATENTS

| | | |
|---|---|---|
| 567,011 | Great Britain | Jan. 24, 1945 |